United States Patent [19]
Bolda et al.

[11] Patent Number: 5,243,232
[45] Date of Patent: Sep. 7, 1993

[54] START-UP PULSE SUPPRESSION CIRCUIT FOR INDUSTRIAL CONTROLLER OUTPUT

[75] Inventors: Daniel J. Bolda, Franklin; Joel C. Clemente, Mequon; Michael A. Feavel, Waukesha; Anthony G. Gibart, Milwaukee; John J. Gilge, Greenfield; Michael R. Havey, Hartland, all of Wis.

[73] Assignee: Allen-Bradley Company, Inc., Milwaukee, Wis.

[21] Appl. No.: 917,661

[22] Filed: Jul. 20, 1992

Related U.S. Application Data

[63] Continuation of Ser. No. 739,129, Jul. 31, 1991, abandoned.

[51] Int. Cl.$^5$ .......................... H03K 5/04; H03K 5/13
[52] U.S. Cl. .................................. 307/296.4; 307/62; 307/141.8; 307/253; 307/296.1; 307/592
[58] Field of Search ............... 307/62, 108, 141, 141.4, 307/141.8, 253, 272.3, 296.1, 296.3, 296.4, 592, 597, 601, 603, 280

[56] References Cited

U.S. PATENT DOCUMENTS

| | | | |
|---|---|---|---|
| 3,106,668 | 10/1963 | Ditto | 307/597 |
| 3,226,567 | 12/1965 | Bradmiller et al. | 307/601 |
| 3,302,062 | 1/1967 | Craig | 307/296.4 |
| 3,376,429 | 4/1968 | Atkins et al. | 307/141 |
| 3,560,767 | 2/1971 | Traub | 307/597 |
| 3,619,668 | 11/1971 | Pinckaers | 307/597 |
| 3,621,276 | 6/1970 | Mitchell | 307/141 |
| 3,645,267 | 2/1972 | Hagfors | 307/141.4 |
| 3,703,648 | 11/1972 | Wrabel | 307/597 |
| 3,710,145 | 1/1973 | Williamson et al. | 307/253 |
| 3,721,861 | 3/1973 | Corderman | 307/141.4 |
| 3,832,627 | 9/1972 | Ohsawa | 307/601 |
| 3,870,905 | 10/1972 | Chikazawa | 307/296.1 |
| 4,317,056 | 2/1982 | Alberts | 307/64 |
| 4,390,794 | 6/1983 | Kuiper et al. | 307/141 |
| 4,536,693 | 8/1985 | Marek | 307/141 |
| 4,574,201 | 3/1986 | Ohyama et al. | 307/253 |
| 4,737,669 | 4/1988 | Austin | 307/592 |
| 4,769,555 | 9/1988 | Pequet et al. | 307/141.4 |
| 4,893,029 | 1/1990 | Matsuo et al. | 307/296.4 |
| 5,030,845 | 7/1991 | Love et al. | 307/272.3 |

Primary Examiner—William L. Sikes
Assistant Examiner—Terry D. Cunningham
Attorney, Agent, or Firm—Quarles & Brady

[57] ABSTRACT

A flash-on reduction circuit for use in the binary state output circuitry of an industrial controller employs a current conductor to charge parasitic capacitances of the output circuitry when the industrial controller is first turned on and a current limiter for preventing high current flows through the output power stages of the output circuit when the industrial controller is first turned on. The current limiter is deactivated by a timing means after the parasitic capacitances have been charged by the current conductor. In a first embodiment, the current conductor and current limiting means are provided by a current source applying increasing power to the output circuit.

7 Claims, 2 Drawing Sheets

START-UP PULSE SUPPRESSION CIRCUIT FOR INDUSTRIAL CONTROLLER OUTPUT

This application is a continuation of application Ser. No. 07/739,129 filed Jul. 31, 1991, now abandoned.

BACKGROUND OF THE INVENTION

This application relates to output circuits associated with industrial controllers and more particularly to a method of preventing output circuits from producing false signals when power is first applied to those output circuits.

Industrial controllers such as those described in U.S. Pat. Nos. 3,810,118; 3,942,158; 4,165,534 and 4,442,504 are typically connected to industrial equipment used in assembly lines or to machine tools, to operate such lines or tools in accordance with a stored program. As distinct from conventional computer systems, industrial controllers generally physically control a process in "real time".

In industrial controllers, such as those disclosed in the above-cited patents, the stored program includes instructions which, when executed, examine the condition of selected inputs to the controller, from sensing devices on the controlled equipment, and energize or de-energize selected outputs from the controller to operate devices on the controlled equipment. Inputs to the controller may be discrete binary signals such as those from switches, which may detect limits of process variables such as motion, temperature, time, or other quantities, or the inputs may be analog measures of the process variables themselves, which are generally then converted to digital binary form for processing.

Likewise, the outputs of the controller may be either binary or "digital" outputs as implemented by mechanical or solid-state relays, or analog outputs produced by means of a digital to analog converter. Electrical isolation is ordinarily incorporated into the output circuits so that potentially harmful voltages and currents from the controlled process cannot damage the industrial controller or find a path through the industrial controller to other outputs. Isolation also serves to prevent undesired current paths in complex installations such as "ground loops", which may affect the integrity of the control system.

The isolation of the outputs is preserved by providing the outputs to the controller with a separate power supply. When power is first provided to the outputs of the industrial controller, the outputs may turn on momentarily despite the absence of an instruction to be in the "on" state from the stored program of the industrial controller. This momentary "on" state, upon application of power, is referred to as "flash-on" and typically lasts anywhere from a few microseconds to tens of milliseconds.

Flash-on is unnoticed in many industrial control applications where the output circuits control relatively slow mechanical actuators, such as contactors and motors, and where a short duration flash-on has no appreciable affect. Also, current practice is often to have the industrial controller and its outputs powered up at all times and restarted only under controlled conditions with collateral equipment deactivated. In such circumstances, flash-on will be unimportant.

SUMMARY OF THE INVENTION

With the increased use of high speed electronics in industrial processes, flash-on may produce erratic start-up conditions unacceptable in an industrial control environment. Flash-on apparently results, primarily, from the intrinsic characteristics of the circuit elements associated with the output circuit of the industrial controller, in particular, the rapid charging of effective "parasitic capacitances" associated with these circuit elements. The present invention recognizes the cause and reduces the amount of the flash-on.

Specifically, in an industrial controller having an isolated amplifier, with associated parasitic capacitances, driving an output stage which controls power to a load, a timer produces a signal defining a first period immediately after the power is applied and a second period a predetermined time after the first period. A conductor charges the parasitic capacitances associated with the isolated amplifier during the first period and a current limiter limits the current flow to the load during the first period but not during the second period.

Thus, it is one object of the invention to reduce flash-on in an industrial controller and thus to ensure a consistent start up-state for the control system upon the application of power to the output circuits. Pre-charging the parasitic capacitances with the conductor while disabling the output stages reduces the flash-on.

It is another object of the invention to provide this reduced flash-on without compromising the isolation of the output circuit. The use of a timer triggered by the application of power to the output circuit eliminates the need for additional non-isolated signals from the industrial controller, such signals which might compromise the isolation of the output circuit or require separate isolation also having flash-on problems.

The conductor and the current limiter may be a controlled current source interposed between the power supply and the isolated amplifier for providing a limited current to the amplifier during the first period and a high current to the amplifier during the second period as controlled by the timer. Alternatively, the conductor and current limiter may be a solid state switch for shunting the low power output of the amplifier to ground only during the first period and simultaneously providing a DC path across the parasitic capacitors.

It is another object of the invention to provide a cost effective reduction of flash-on without the addition of multiple complex circuits. The controlled power supply may be shared among a number of the isolated amplifiers, which are relatively low powered, such amplifiers being associated with multiple output circuits. Similarly, the shunting solid state switch may be shared among a number of isolated amplifier outputs which are also of low power. This ability to share the flash-on reduction circuit among outputs thus reduces the cost of flash-on reduction for multiple output systems without unduly increasing the power handling capabilities of the components of the flash-on reduction circuit.

The foregoing and other objects and advantages of the invention will appear from the following description. In the description, reference is made to the accompanying drawings which form a part hereof and in which there is shown by way of illustration, a preferred embodiment of the invention. Such embodiment does not necessarily represent the full scope of the invention, however, and reference is made therefore to the claims herein for interpreting the scope of the invention.

DETAILED DESCRIPTION OF THE PREFERRED EMBODIMENT

The Industrial Controller

Figure 1:
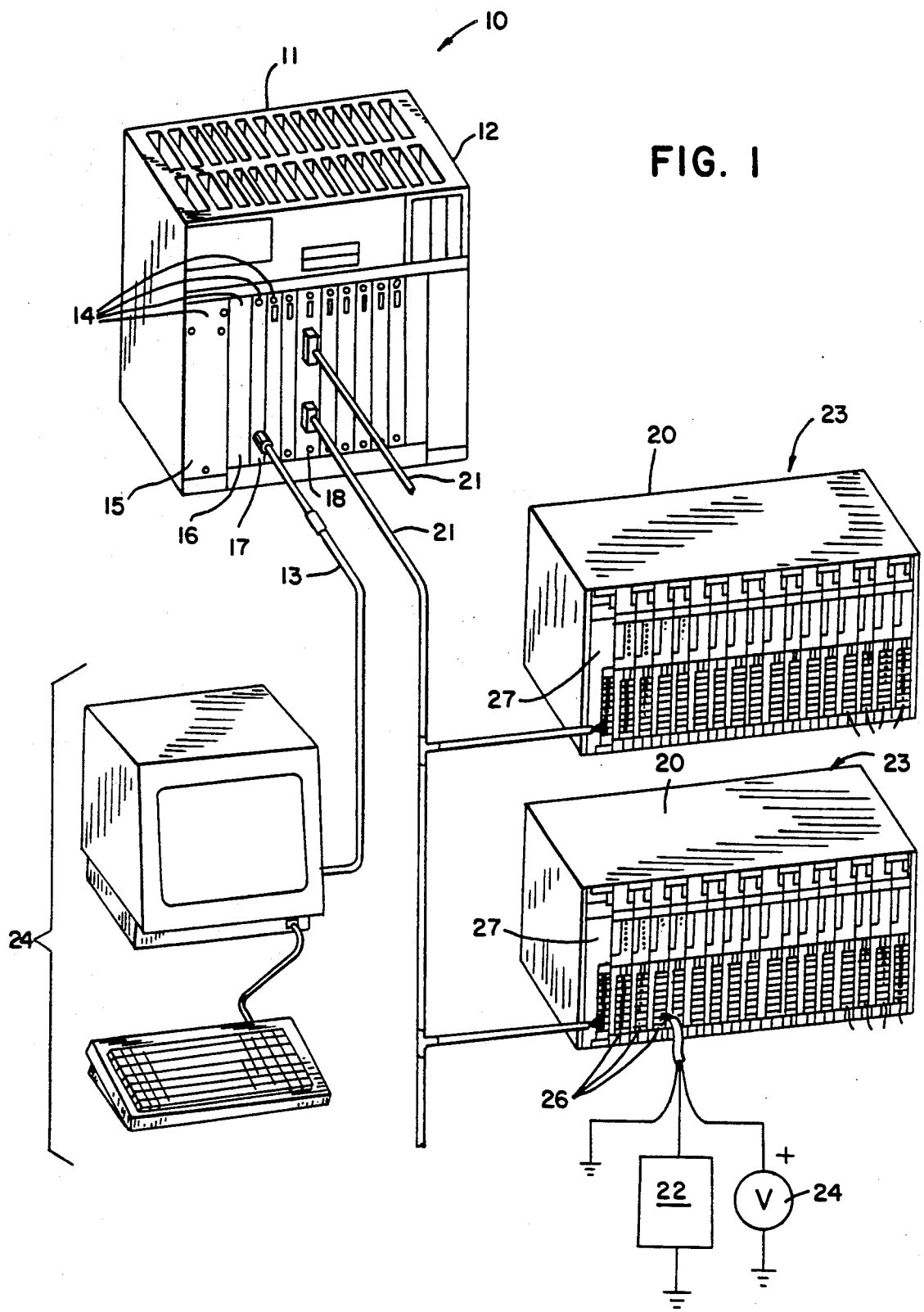
FIG. 1 is a perspective view of an industrial controller having a number of remote I/O modules including output circuits.
Figure 2:
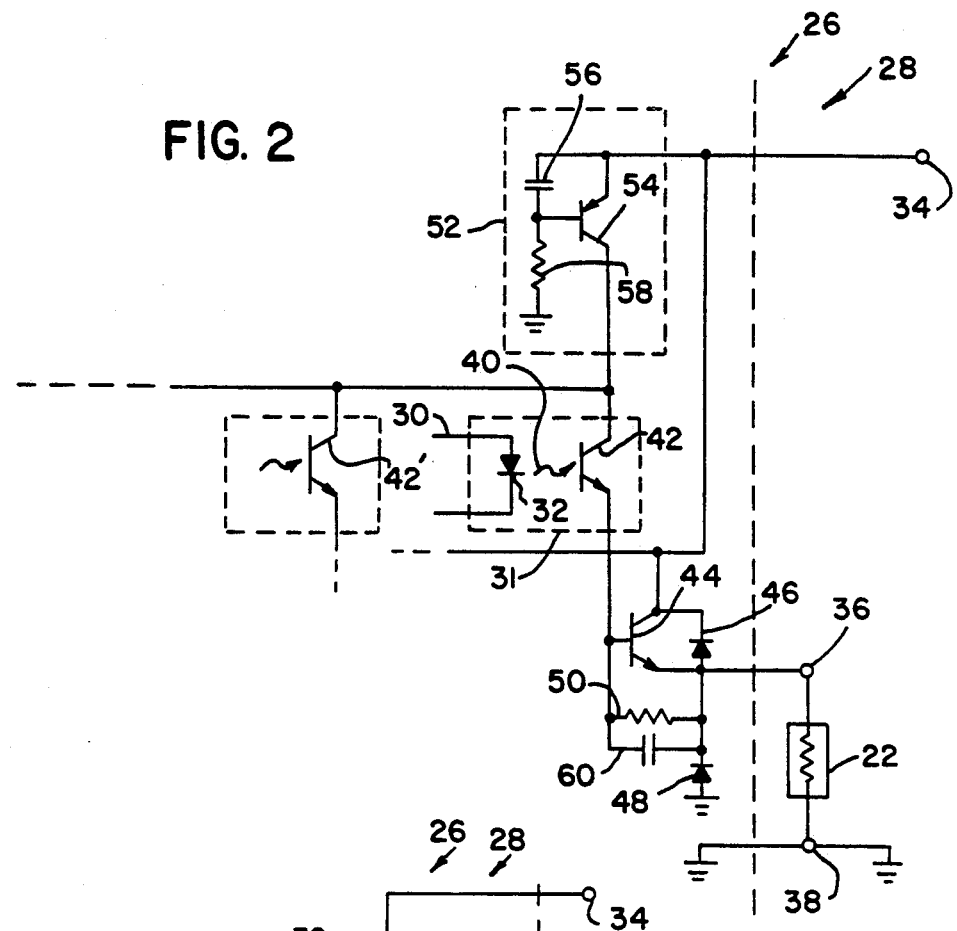
FIG. 2 is a schematic of an output circuit of FIG. 1 employing a first embodiment of the flash-on reduction circuit.

With initial reference to FIGS. 1 and 2, an industrial control system, incorporating the present invention, is comprised of a controller 10 housed in a rack 12 which includes a series of slots that receive a plurality of printed circuit board modules 14 and 15. These modules 14 connect to a backplane 11 which extends along the rear surface of the rack 12.

The backplane 11 has a plurality of module connectors which are connected by a conductive pattern on the backplane 11, providing a high speed bus interconnecting modules 14 and providing power from power supply 15. A detailed description of a high speed bus suitable for use with the invention is given in U.S. Pat. No. 3,815,099 issued Jun. 4, 1974, and entitled "Data Processing System".

A processor module 16 executes a user defined application program, stored in the processor module's random ("RAM"), to operate the equipment connected to the industrial control system.

An interface module 17 provides communication between the processor module 16 and a programming terminal 24 via a cable 13. The programming terminal 24 provides a means of monitoring the operation of the industrial controller and for programming the processor 16.

An I/O scanner module 18 provides communication between the processor 16 and remotely located I/O racks 20. The I/O scanner module 18 communicates with the processor module 16 via the backplane 11 and communicates with the I/O racks 20 via high speed serial data links 21.

Each I/O rack 20 includes a remote I/O adapter 27 and a number of I/O modules 26. The I/O adapter 27 receives output signals from the link 21 and communicates the signals to the appropriate I/O module 26 via a backplane 23.

Referring also to FIG. 2, a given I/O module 26 may be comprised of a number of digital output circuits 28 which communicate with the controller 10 through the link 21 and the adapter 27 to turn a controlled device 22 either on or off.

Each output circuit 28 has terminals 34 and 38 to receive ground and power from a power supply 24, associated with the controlled device 22 and isolated from the power supply of the industrial controller 10. The digital output circuits 28 also include one or more terminals 36 connected to the controlled device 22 to allow it to be turned off and on by switching the power from the power supply 24 to the controlled device 22 off and on.

The Output Circuits

As shown in FIG. 2, a digital output circuit 28 of an I/O module 26 provides a power terminal 34, an output terminal 36 and a ground terminal 38. The external power supply 24 (shown in FIG. 1) is connected between the power terminal 34 and the ground terminal 38. The load of the controlled device 22 is typically then connected between the output terminal 36 and the ground terminal 38.

The power terminal 34, when connected to the external power supply 24, will be at a higher potential than the ground terminal 38, as is typical in the art. Nevertheless, the term "ground" will be understood to embrace both "positive" and "negative" ground conventions, the present invention being applicable to either, and therefore the term "ground" must be considered simply as referring most generally to the return path to the power supply 24.

During the operation of the digital output circuit 28, the controlled device 22 will be connected through output terminal 36 to the power supply 24 via power terminal 34 during an "on" state, and will be disconnected from the power supply 24 during an "off" state.

The state of the output circuit 28 is determined by the state of a digital signal 30 transmitted from the industrial controller 10 via the adapter 27 and backplane 23 to the particular I/O module 26 and output circuit 28. This digital signal 30 is received by the digital output circuit 28 through an opto-isolator 31, which serves to prevent potentially damaging voltages and currents at terminals 34, 36 or 38 from traveling backwards along the path of digital signal 30 and damaging the industrial control system or affecting other output circuits 28.

The digital signal 30 is manifest as a current through LED 32. When current is flowing through LED 32, the output circuit is in the "on" state and when current is not flowing through LED 32 the digital output circuit is in the "off" state.

The flow of current through LED 32 produces a light signal 40 received by NPN photo-transistor 42. When the collector of transistor 42 is biased to a positive voltage through power terminal 34, the light signal 40 causes current to flow from the collector to the emitter of transistor 42, the latter of which is connected to the base of NPN power transistor 44.

The collector of power transistor 44 is connected directly to terminal 34 to receive power therefrom and the emitter of power transistor 44 is connected to output terminal 36. Thus, the presence of current through LED 32 causes current to flow from power supply terminal 34 through power transistor 44 to output terminal 36 and through controlled device 22 to ground 38. Conversely, when current ceases to flow through LED 34, power transistor 44 stops conducting, breaking the circuit between power terminal 34 and output terminal 36 through controlled device 22.

Protective diodes 46 and 48 connect the output terminal to the power terminal 34 and ground terminal 38, respectively The anode of protective diode 46 is connected to the output terminal 36 and its cathode is connected to the power terminal 34, and the anode of protection diode 48 is connected to the ground terminal 38 and its cathode is connected to the output terminal 36. Thus, the voltage at output terminal 36 is restrained to be roughly between ground and the voltage applied to power terminal 34, thereby protecting transistor 44 from inductively induced voltage spikes and the like. A biasing resistor 50 connects from the base to the emitter of the power transistor 44 and serves to bias the output transistor 44 into the active region.

The circuit thus described is replicated for each output circuit 28 and, when the collector of transistor 42 is connected directly to the power supply 24 through terminal 34 (in distinction to the circuit shown in FIG. 2), the described circuit is typical of prior art output circuits 28 used with industrial controllers 10.

When the collector of transistor 42 is connected directly to the power terminal 34, as described above, the collector of transistor 42 experiences a step in voltage when power from power supply 24 is first applied to terminal 34. Although applicant does not wish to be bound by a particular theory, it is believed that the flash-on, as previously described, results from unintended capacitances shunting the collector and emitter of transistor 42 and connecting the collector and base of transistor 42 ("Miller Effect" capacitance) and shunting the collector and emitter of power transistor 44 and connecting the collector and base of transistor 44. These capacitances will henceforth be termed generally "parasitic capacitances". The term "parasitic capacitance" should also be considered to embrace mechanisms of charge storage, peculiar to the semiconductor devices, which although not truly caused by a capacitor structure may be accurately modeled as such.

The high frequency components of the step function of voltage at terminal 34 are passed by these parasitic capacitances, causing a brief flow of current across the collector and emitter of transistor 42 and into the base of transistor 42. These currents together with the current flowing through the parasitic capacitance across the collector and emitter of transistor 44, produce the flash-on at terminal 36.

First Embodiment

In a first embodiment of the invention shown in FIG. 2, the collector of transistor 42 is not connected directly to power terminal 34 as described above, but instead connects to ramp generating circuit 52, which, with the application of step of voltage at terminal 34, produces a ramp of voltage at the collector of transistor 42. Ramp generating circuit 52 is comprised of a PNP transistor 54 having its emitter connected to power terminal 34 and its collector connected to the collector of transistor 42. The base of PNP transistor 54 is connected to the junction of series connected capacitor 56 and resistor 58 which together provide an RC time constant delaying the turn-on of transistor 54. Specifically, capacitor 56 has one terminal connected to power terminal 34 and the other terminal connected to the base of transistor 54. Resistor 58 has one terminal connected to the base of transistor 54 and the other terminal connected to ground.

When power is first introduced to terminal 34, the capacitor 56 acts like a short circuit biasing off transistor 54. Capacitor 56 is slowly charged through resistor 58, thus biasing on transistor 54 and providing a ramp of voltage to the collector of transistor 42. This ramp of voltage has far fewer high frequency components than the step function of voltage obtained directly at the terminal 34, and thus significantly reduces the amount of current passed by the parasitic capacitances associated with transistor 42, previously described. Nevertheless, the ramp of voltage at the collector of transistor 42 allows charging of the parasitic capacitances associated with transistor 42 without biasing on the transistor 44.

In the preferred embodiment, the time constant of the network of capacitor 56 and resistor 58 is set to approximately two milliseconds. Also, the ramp generator circuit 52 is augmented by filter capacitor 60, which shunts the base and emitter of power transistor 44 for the high frequency voltage components associated with the high dv/dt of voltage at terminal 34, which is still connected directly to the collector of transistor 44.

Typically, a large number of output circuits 28 are contained in one I/O module 26 and it will be understood from the foregoing description that the ramp generating circuit 52 may thus serve to provide collector voltage to additional photo transistors 42' associated with different digital output circuits 28, thus reducing the cost of the flash-on reduction circuitry of 52 on a per output basis. The filter capacitor 60, which must be reproduced for each digital output circuit 28, is of acceptably low cost. Connecting the collectors of power transistors 44 directly to terminal 34 rather than to the ramp generating circuit 52, for each of the output circuits 28, allows transistor 54 of the ramp generating circuit 52 to be of relatively low power, further reducing the cost of this circuit.

Second Embodiment

Figure 3:
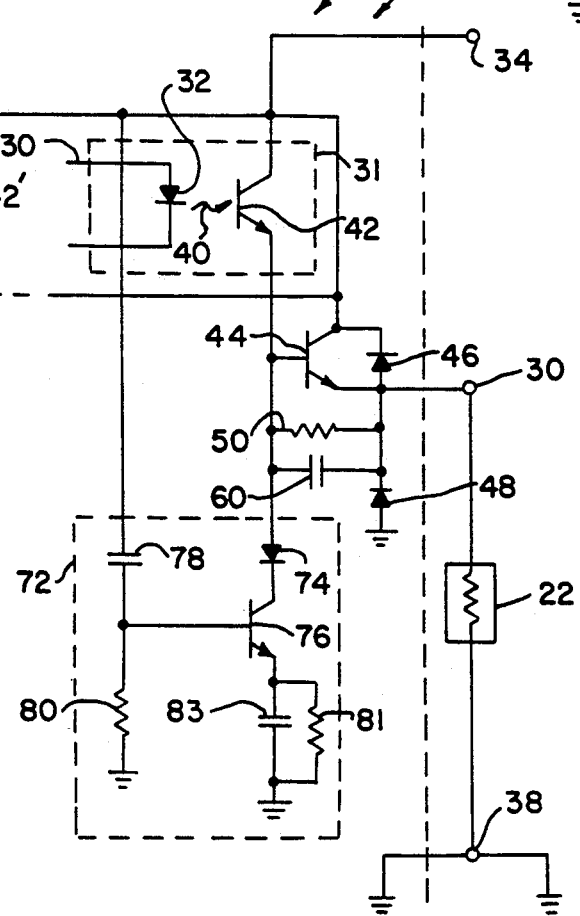
FIG. 3 is a schematic similar to FIG. 2 and showing a second embodiment of the flash-on reduction circuit.

Referring to FIG. 3, in a second embodiment, a suppressor circuit 72 is used instead of the ramp generator 52 previously described. The output circuit 28 is generally the same as that described in the first embodiment with respect to FIG. 2, but with the collector of transistor 42 connected directly to power terminal 34.

The suppressor circuit 72 attaches to the base of power transistor 44 and pulls that base to ground, effectively turning off the output circuit 28, for a short period of time after power is introduced to the power terminal 34. Specifically, the anode of a blocking diode 74 of the suppression circuit 72 is connected to the base of transistor 44. The cathode of blocking diode 74 connects to the collector of an NPN transistor 76 whose emitter is connected through capacitor 83 to ground. A resistor 81 shunts capacitor 83. The base of transistor 76 is connected to an RC circuit comprised of series connected capacitor 78 and resistor 80. Specifically, the base of transistor 76 is connected to the junction of capacitor 78 and resistor 80 and the remaining terminal of resistor 80 is connected to ground while the remaining terminal of capacitor 78 is connected to terminal 34.

At the instant power is applied to power terminal 34, the base of transistor 76 will be pulled to a high voltage, biasing transistor 76 into saturation and pulling the base of transistor 44 nearly to ground. Thus, any current produced by the parasitic capacitances associated with transistor 42, and the parasitic capacitance to the base of transistor 44, will be shunted to ground through blocking diode 74, transistor 76 and capacitor 83.

Later, after power is applied to power terminal 34, resistor 80 charges capacitor 78, returning the base of the transistor 76 to ground and turning transistor 76 off. At this time, the base of transistor 44 is responsive to currents from transistor 42 produced by digital signal 30 per normal operation of the output circuit 28. Capacitor 83 limits the conduction time of transistor 76 preventing damage to transistors 42, 44 and 76 and diode 74 under certain noise conditions. Resistor 81 discharges capacitor 83 after the period of potential flash-on is over.

The time constant of capacitor 78 and resistor 80 is adjusted to hold transistor 76 into saturation for a period of time exceeding the duration of flash-on associated with the parasitic capacitances of transistor 42 and transistor 44.

Again, a single suppression circuit 72 may serve multiple digital output circuits 28 through the use of multiple blocking diodes 74. Specifically, the anode of a different diode 74 is connected to the base of each power transistor 44 associated with each digital output circuit 28 and the cathodes of the diodes 74 are connected in common to the collector of transistor 76. The multiple blocking diodes prevent current from passing between the bases of the power transistors 44 during normal operation when only some power transistors 44 are being biased on.

Each of the above described embodiments preserves the isolation provided by the light signal 40 between diode 32 and photo transistor 42 forming optoisolator 31 as they are triggered by a signal derived from isolator power supply 24. Further, each of these flash-on reduction circuits 52, 72 may be efficiently shared among multiple digital output circuits 28 in a single I/O module 26. Fundamental to the operation of each embodiment is a timing means, provided in each case by a resistor capacitor network, which controls the current flowing through the path from power terminal 34 through transistor 42, transistor 44, and through the load of the controlled device 22 to ground 38. In particular, the timing circuit provides a first period of low current flow to charge the parasitic capacitances and a second period of high current flow during which the output circuit operates in a normal manner.

In the circuit of FIGS. 2 and 3, the charging of the parasitic capacitance is accomplished during the early stages of the ramp produced by the ramp circuit 52. In the circuit of FIG. 3, the charging of the parasitic capacitance is accomplished through a separate circuit path through transistor 76.

Despite these similarities, each of the circuits have unique advantages. The embodiment of FIG. 3 requires substantially lower current capacity in transistor 76 than the relatively high powered circuit 52. The circuit of the embodiment shown in FIG. 2 has the fewest required components.

In the description of the circuits of the present invention, the flow and control of electrical currents to a load have been described. It will be understood, however, that the circuits in fact control the application of power, rather than the current, to the load, and that the described currents exist in the presence of motivating voltages that may or may not be described. Accordingly, the current controlling elements described above should be considered to be, more generally, current and voltage controlling elements, as will be understood to those of ordinary skill in the art.

Several preferred embodiments of the invention have been described, but is should be apparent to those skilled in the art that many variations can be made without departing from the spirit of the invention. For example, the timing elements of these circuits may be realized through digital techniques, for example. Also, although the flash-on problem has been identified to the turning on of an external power supply, it will be recognized that the above described circuits are equally applicable to the controlling of transient currents and voltages caused by the turning on of internal power supplies. In order to apprise the public of the various embodiments that may fall within the scope of the invention, the following claims are made.

We claim:

1. An industrial controller output circuit employed with an industrial controller having an internal power supply generating a control signal, the industrial controller output circuit comprising:

a power terminal for connection to power from an external power supply, electrically independent of the internal power supply, for receiving power from the external power supply only when the external power supply is so connected;

an amplifier means receiving power at a power input node from the external power supply, through the power terminal, and receiving the control signal at an amplifier input for producing an output electrically isolated from the control signal, the amplifier having a parasitic capacitance which can cause high frequency components of voltage at the power input node to be reflected at the electrically isolated output due to flash on;

a power stage receiving power from the external power supply, through the power terminal, and receiving the electrically isolated output at a power stage input, the power stage connected to a load for providing current to that load;

a timing means connected to the power terminal for providing a timing signal delineating two time periods, the first time period beginning at the time of connection of power of the external power supply to the power terminal and expiring a predetermined time after that connection and the second time period beginning at the expiration of the first time period;

a current conducting means connected between the power supply and the amplifier means and receiving the timing signal for charging the parasitic capacitance during the first time period and limiting the rate of current flow into the power stage input during the first time period but not during the second time period.

2. The industrial controller output circuit recited in claim 1 wherein the timing means is a series connected resistor and capacitor, the resistor charging the capacitor when the power from the external power supply is connected to the power terminal and wherein the timing signal delineating the first and second time periods is a voltage which indicates the expiration of the first time period and the beginning of the second time period when the voltage of the timing signal reaches a first predetermined value at the junction of the resistor and capacitor.

3. The industrial controller output circuit recited in claim 1 wherein the current conducting means is a current source electrically connected between the power terminal and the power input node of the amplifier means for providing a low current to the amplifier means during the first time period for charging the parasitic capacitance and a high current to the amplifier means during the second time period as controlled by the timing means.

4. The industrial controller output circuit recited in claim 3 wherein the amplifier means is a photosensitive semiconductor and the control signal is a light signal and wherein the current conducting means provides current to one lead of the photosensitive semiconductor and the other lead of the photosensitive semiconductor is connected to the output power stage input.

5. An industrial controller output circuit employed with an industrial controller having an internal power supply generating a control signal, the industrial controller output circuit comprising:

a power terminal for connection to power from an external power supply also having a ground, electrically independent of the internal power supply, for receiving power from the external power supply only when the external power supply is so connected;

an amplifier means receiving power at a power input node from the external power supply, through the power terminal, and receiving the control signal at an amplifier input for producing an output electrically isolated form the control signal, the amplifier having a parasitic capacitance which can cause high frequency components of voltage at the power input node to be reflected at the electrically isolated output due to flash on;

a power stage receiving power from the external power supply, through the power terminal, and receiving the electrically isolated output at a power stage input, the power stage connected to a load for providing current to that load;

a timing means connected to the power terminal for providing a timing signal delineating two time periods, the first time period beginning at the time of connection of power of the external power supply to the power terminal and expiring a predetermined time after that connection and the second time period beginning at the expiration of the first time period; and a current conducting means connected between the ground and the amplifier means and receiving the timing signal for disabling the power stage during the first time period but not during the second time period.

6. The industrial controller output circuit recited in claim 5 wherein the timing means is a series connected resistor and capacitor, the resistor charging the capacitor when the power to the external power supply is connected to the power terminal and wherein the timing signal delineating the first and second time periods is a voltage which indicates the expiration of the first time period when the voltage of the timing signal reaches a first predetermined value at the junction of the resistor and capacitor.

7. The output circuit recited in claim 5 wherein the current conducting means is connected by a current path to the electrically isolated output of the amplifier means and is a solid state switch for shunting the power stage input to ground only during the first period.

* * * * *